United States Patent
Liu et al.

(10) Patent No.: US 10,897,260 B2
(45) Date of Patent: Jan. 19, 2021

(54) SYSTEMS AND METHODS FOR PERFORMING PHASE ERROR CORRECTION

(71) Applicant: Marvell World Trade Ltd., St. Michael (BB)

(72) Inventors: Zhao Liu, Shanghai (CN); Wen Yan, Shanghai (CN); Zhenhua Xiong, Shanghai (CN); Liang Yuan, Shanghai (CN); Hongzheng Han, Shanghai (CN); Yuan Lu, Sunnyvale, CA (US)

(73) Assignee: Marvell Asia Pte, Ltd., Singapore (SG)

( * ) Notice: Subject to any disclaimer, the term of this patent is extended or adjusted under 35 U.S.C. 154(b) by 0 days.

(21) Appl. No.: 15/366,820

(22) Filed: Dec. 1, 2016

(65) Prior Publication Data

US 2018/0091162 A1    Mar. 29, 2018

Related U.S. Application Data

(60) Provisional application No. 62/400,289, filed on Sep. 27, 2016.

(51) Int. Cl.
*H03L 7/099* (2006.01)
*H03L 7/183* (2006.01)
*H03L 7/093* (2006.01)
*H03L 7/091* (2006.01)

(52) U.S. Cl.
CPC .......... *H03L 7/0991* (2013.01); *H03L 7/091* (2013.01); *H03L 7/093* (2013.01); *H03L 7/099* (2013.01); *H03L 7/183* (2013.01)

(58) Field of Classification Search
CPC ... H03L 7/0991; H03L 7/0992; H03L 7/0993; H03L 7/091; H03L 7/099; H03L 7/197; H03L 7/1972; H03L 7/1974; H03L 7/1976; H03L 7/1978
USPC ........................................................ 327/158
See application file for complete search history.

(56) References Cited

U.S. PATENT DOCUMENTS

| | | | |
|---|---|---|---|
| 2008/0157888 A1* | 7/2008 | Goldman | H03L 7/093 331/1 R |
| 2008/0269928 A1* | 10/2008 | May | H03L 7/081 700/94 |
| 2013/0009682 A1* | 1/2013 | Kyles | H03L 7/07 327/156 |
| 2013/0088300 A1* | 4/2013 | Ichihara | H03L 7/085 331/25 |
| 2018/0091161 A1* | 3/2018 | Chou | H03L 7/0991 |

* cited by examiner

*Primary Examiner* — Patrick C Chen

(57) ABSTRACT

Systems and methods for performing phase error correction are provided. A reference clock signal and a target clock signal are received. A first value is generated based on a first amount of time between a first edge of the reference clock signal and a corresponding first edge of the target clock signal. A phase of the target clock signal is adjusted a first time based on a given amount computed using the first value. After the phase of the target clock signal is adjusted, a second value is generated based on a second amount of time between a second edge of the reference clock signal and a corresponding second edge of the target clock signal. The phase of the target clock signal is adjusted a second time based on the given amount, the first value, and the second value.

18 Claims, 5 Drawing Sheets

SYSTEMS AND METHODS FOR PERFORMING PHASE ERROR CORRECTION

CROSS-REFERENCE TO RELATED APPLICATION

This disclosure claims the benefit of U.S. Provisional Patent Application No. 62/400,289, filed on Sep. 27, 2016, which is hereby incorporated by reference in its entirety.

FIELD OF USE

The present disclosure relates generally to phase-locked loops (PLLs), and more particularly to phase calibration technology used in PLLs.

BACKGROUND

The background description provided herein is for the purpose of generally presenting the context of the disclosure. Work of the inventors hereof, to the extent the work is described in this background section, as well as aspects of the description that may not otherwise qualify as prior art at the time of filing, is neither expressly nor impliedly admitted as prior art against the present disclosure.

A PLL is widely used in wireless applications, remote communications applications, computer applications, and electronic applications. A PLL is used to generate a stable frequency (frequency synthesis), perform clock and data recovery (CDR) from a high-speed serial data stream, and to distribute an accurate clock pulse (clock tree) in a digital logic circuit. After a PLL is started or after the PLL deviates from a stable state, performing PLL locking takes a considerable amount of time (locking time) which negatively impacts performance of the overall system.

Traditional systems attempt to reduce the locking time by creating a one loop bandwidth during a locking stage that is excessively large, and subsequently creating another loop bandwidth that is reduced to acquire more desirable performance. However, even in such systems, the locking time of the PLL is usually still too long to satisfy certain application requirements. The performance of locking the PLL in such traditional systems is also degraded due to the dependence on the change of frequency of a voltage controlled oscillator (VCO) for calibrating a phase error when the frequency is already locked.

SUMMARY

Systems and methods for performing phase error correction are provided. In some embodiments, a reference clock signal and a target clock signal are received. A first value is generated based on a first amount of time between a first edge of the reference clock signal and a corresponding first edge of the target clock signal. A phase of the target clock signal is adjusted a first time based on a given amount computed using the first value. After the phase of the target clock signal is adjusted, a second value is generated based on a second amount of time between a second edge of the reference clock signal and a corresponding second edge of the target clock signal. The phase of the target clock signal is adjusted a second time based on the given amount, the first value, and the second value.

In some implementations, the phase is adjusted the first time during a second clock cycle of the reference clock and the phase is adjusted the second time during a fourth clock cycle of the reference clock. In some implementations, the first amount of time is measured during a first clock cycle of the reference clock and the second amount of time is measured during a third clock cycle of the reference clock.

In some implementations, the phase is adjusted by modifying a gain of a feedback divider based on the given amount. In some implementations, the gain of the feedback divider corresponds to an inverse of a sum of a constant and a variable.

In some implementations, the variable is set to zero when the first amount of time is measured, the variable is set to the given amount to adjust the phase the first time, the variable is set to zero after the phase is adjusted the first time, and the variable is set to a second amount based on the given amount, the first value, and the second value to adjust the phase the second time.

In some implementations, the given amount is computed in accordance with:

$$Nx_2 = \text{round}(OT1/g\_tdc\_est/Tdco/2)$$

where $Nx_2$ is the given amount, $OT1$ is the first value, $g\_tdc\_est$ is a first constant, and $Tdco$ is a second constant.

In some implementations, the second amount is computed in accordance with:

$$Nx_4 = \text{round}(Nx_2 * OT3/(OT1 - OT3))$$

where $Nx_4$ is the second amount, $Nx_2$ is the given amount, $OT1$ is the first value, and $OT3$ is the second value.

In some implementations, the target clock signal corresponds to an output of a digitally controlled oscillator. In some implementations, the target clock signal corresponds to an output of a voltage controlled oscillator.

BRIEF DESCRIPTION OF THE DRAWINGS

The details of one or more implementations are set forth in the accompanying drawings and the description below. Other features and various advantages will be more apparent upon consideration of the following detailed description, taken in conjunction with the accompanying drawings in which.

DETAILED DESCRIPTION

Systems and methods for performing phase error correction are provided. In particular, phase correction is performed in two steps which significantly reduces the locking time. The phase correction is performed by calculating and compensating for the phase error at the frequency dividers, instead of relying on the VCO and feedback loop. In some embodiments, the phase correction and locking time is performed in four clock cycles.

Figure 1:
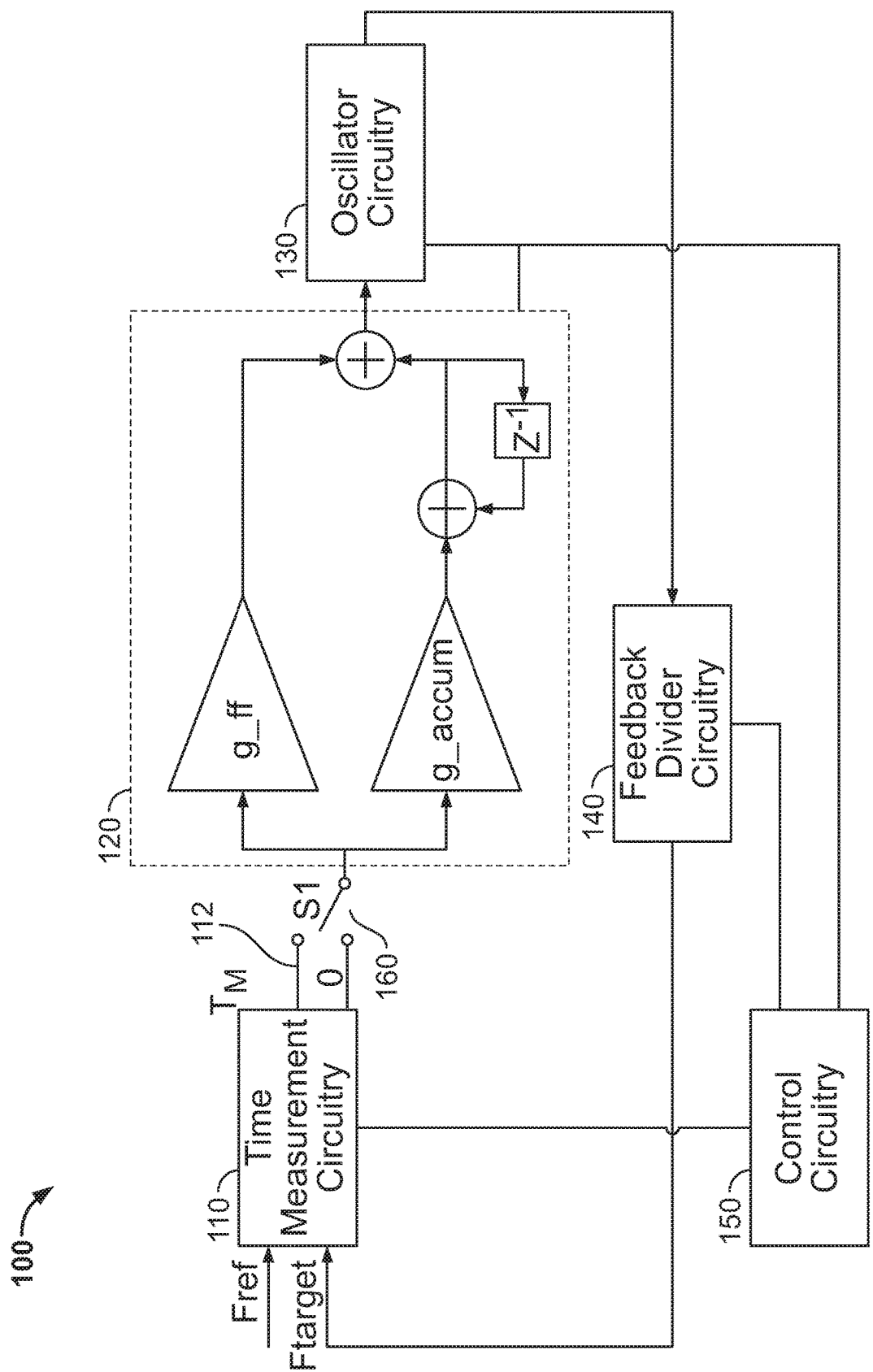
FIG. 1 shows an exemplary digital phase error correction system in accordance with various embodiments.

FIG. 1 shows an exemplary digital phase error correction system 100 in accordance with various embodiments. System 100 includes time measurement circuitry 110, loop-filter circuitry 120, oscillator circuitry 130, feedback divider circuitry 140, and control circuitry 150. Oscillator circuitry 130 may be any circuitry capable of generating a clock signal, such as a voltage controlled oscillator and/or a digitally controlled oscillator. Time measurement circuitry 110 may include a time to digital converter circuit (TDC). Time measurement circuitry 110 may receive a reference frequency clock signal (Fref) and a target frequency clock signal (Ftarget). Fref signal may be a constant clock signal to which the Ftarget signal is synchronized. Feedback divider circuitry 140 may be coupled to oscillator circuitry 130 and may output the Ftarget signal to time measurement circuitry 110.

As discussed below, phase error correction may be performed in four clock cycles of the Fref signal. Initially, when phase error correction is started, a switch 160 may be controlled to couple Loop-filter circuitry 120 to the value '0'. During a first clock cycle, the dividing ratio of feedback divider circuitry 140 is set to a constant and a first time difference between the rising edge of the Fref signal and the rising edge of the Ftarget signal is measured. This first time difference is used to generate a first value for adjusting the dividing ratio of feedback divider circuitry 140 in a second clock cycle.

During the second clock cycle of the Fref signal, the dividing ratio of feedback divider circuitry 140 is set to a given amount based on the first value generated using the first time difference. A second time difference between the rising edge of the Fref signal and the rising edge of the Ftarget signal is measured during the second clock cycle.

During a third clock cycle of the Fref signal, the dividing ratio of feedback divider circuitry 140 is set back to the constant and a third time difference between the rising edge of the Fref signal and the rising edge of the Ftarget signal is measured. This third time difference is used to generate a second value for adjusting the dividing ratio of feedback divider circuitry 140 in a fourth clock cycle.

During the fourth clock cycle of the Fref signal, the dividing ratio of feedback divider circuitry 140 is set based on the first value, the second value, and the given amount. A fourth time difference between the rising edge of the Fref signal and the rising edge of the Ftarget signal is measured. At this point, the phase error correction ends (e.g., after four clock cycles of the Fref signal) and switch 160 may be controlled to couple Loop-filter circuitry 120 to the output $T_M$ 112 of time measurement circuitry 110.

In some embodiments, feedback divider circuitry 140 receives a clock signal from oscillator circuitry 130 and may perform phase adjustment on the clock signal to generate the Ftarget signal. In some implementations, the phase adjustment may be performed in accordance with the function $1/(N_{div}+N_x)$, where $N_{div}$ is a phase adjustment constant and $N_x$ is a phase adjustment variable. Control circuitry 150 may indicate to feedback divider circuitry 140 the values to which $N_x$ is to be set during each clock cycle. For example, during a first clock cycle of Fref, control circuitry 150 may instruct feedback divider circuitry 140 to set $N_x$ to the value '0'. This may be performed in some embodiments on the falling edge of the signal Ftarget.

During each clock cycle of the Fref signal, time measurement circuitry 110 may measure an amount of time that the Fref signal leads or lags the Ftarget signal. For example, time measurement circuitry 110 may detect a rising edge of the Fref signal. In response to detecting the rising edge of the Fref signal, time measurement circuitry 110 may reset and start a timer and may monitor the edges of the Ftarget signal. In response to detecting a rising edge of the Ftarget signal, time measurement circuitry 110 may stop the timer and may determine the amount of time between the rising edge of the Fref signal and the rising edge of the Ftarget signal.

Time measurement circuitry 110 may output a value $T_M$ 112 based on a mathematical function of the measured amount of time and a constant (e.g., g_tdc). In some implementations, time measurement circuitry 110 may multiply the measured amount of time by the constant g_tdc to output value $T_M$ 112. In some embodiments, value $T_M$ 112 may be configured to be output by time measurement circuitry 110 on the falling edge of the Fref signal.

In some implementations, time measurement circuitry 110 may measure the amount of time that the Fref signal leads or lags the Ftarget signal based on a falling edge of the Fref signal relative to the falling edge of the Ftarget signal in a similar manner. In some implementations, time measurement circuitry 110 may measure the amount of time that the Fref signal leads or lags the Ftarget signal based on a combination of the rising and falling edges of the Fref signal relative to the rising and falling edges of the Ftarget signal in a similar manner.

Figure 2:
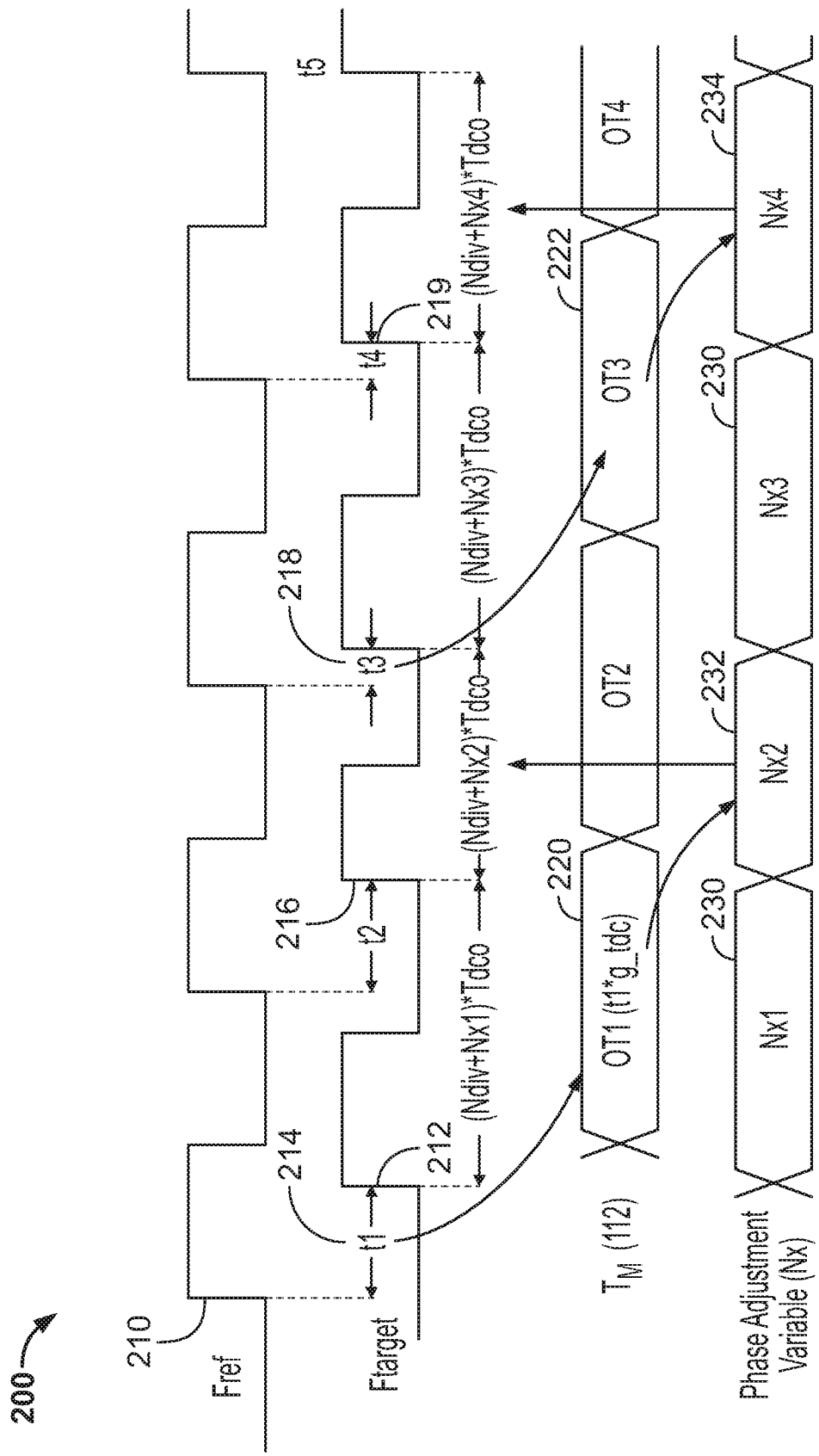
FIG. 2 shows an exemplary timing diagram for performing digital phase error correction in accordance with various embodiments.

For example, timing diagram 200, shown in FIG. 2, demonstrates digital phase error correction in accordance with various embodiments. In particular, a phase adjustment variable ($N_x$) of feedback divider circuitry 140 may initially be set to a first division value 230 ($N_{x1}$) equivalent to '0' during a first clock cycle of the Fref signal. The setting of the phase adjustment variable ($N_x$) to the division value '0' may be performed upon detecting the rising edge 212 of the Ftarget signal. This results in feedback divider circuitry 140 outputting Ftarget signal that corresponds to the oscillator circuitry 130 signal output being frequency divided based on the constant $N_{div}$.

Also, during the first clock cycle of the Fref signal, time measurement circuitry 110 may detect a first rising edge 210 of the Fref signal. In response to detecting first rising edge 210 of the Fref signal, time measurement circuitry 110 may measure the amount of time 214 until the first rising edge 212 of the Ftarget signal is detected. During this first clock cycle of the Fref signal, time measurement circuitry 110 may multiply amount of time 214 by the constant (g_tdc) to generate and output the first time value OT1 220. In some implementations, first time value OT1 220 may be output at the falling edge of the Fref signal in the first clock cycle.

During the second clock cycle of the Fref signal, the phase adjustment variable ($N_x$) of feedback divider circuitry 140 may be set to a second division value 232 ($N_{x2}$) based on first time value OT1 220. For example, second division value 232 ($N_{x2}$) may be set to an integer number computed in accordance with round (OT1/g_tdc_est/Tdco/2), wherein OT1 corresponds to first time value OT1 220, g_tdc_est is a first constant and Tdco is a second constant. The setting of the phase adjustment variable ($N_x$) to second division value 232 may be performed upon detecting the rising edge 216 of the Ftarget signal. This results in feedback divider circuitry 140 outputting an Ftarget signal that corresponds to the oscillator circuitry 130 signal output being frequency divided based on the constant $N_{div}$ and second division value 232 ($N_{x2}$) (e.g., $1/(N_{div}+N_{x2})$).

During a third clock cycle of the Fref signal, the phase adjustment variable ($N_x$) of feedback divider circuitry 140 may be set to the first division value 230 ($N_{x3}$) equivalent to '0'. The setting of the phase adjustment variable ($N_x$) to the division value '0' may be performed upon detecting the rising edge 212 of the Ftarget signal. This results in feedback divider circuitry 140 outputting an Ftarget signal that corresponds to the oscillator circuitry 130 signal output being frequency divided based on the constant $N_{div}$. During this third clock cycle of the Fref signal, time measurement circuitry 110 may multiply the amount of time 218 by the constant (g_tdc) to generate and output the second time value OT3 222. In some implementations, second time value OT3 222 may be output at the falling edge of the Fref signal in the third clock cycle.

During a fourth clock cycle of the Fref signal, phase adjustment variable ($N_x$) of feedback divider circuitry 140 may be set to a third division value 234 ($N_{x4}$) based on first time value OT1 220, second time value OT3 222, and second division value 232. For example, third division value 234 ($N_{x4}$) may be set to an integer number computed in accordance with round ($N_{x2}$*OT3/(OT1−OT3)), wherein OT1 corresponds to first time value OT1 220, OT3 corresponds to second time value OT3 222, and $N_{x2}$ corresponds to second division value 232. The setting of the phase adjustment variable ($N_x$) to third value 234 may be performed upon detecting the rising edge 219 of the Ftarget signal. This results in feedback divider circuitry 140 outputting Ftarget signal that corresponds to the oscillator circuitry 130 signal output being frequency divided based on the constant $N_{div}$ and third division value 234 ($N_{x4}$) (e.g., $1/(N_{div}+N_{x4})$).

In some embodiments, the first time value OT1 220, second time value OT3 222, and second division value 232 derived based on the above can be used to adjust a gain of time measurement circuitry 110. Specifically, the g_tdc value by which a time difference between two clock edges is multiplied may be calibrated or adjusted in accordance with the following equation: g_tdc=(OT1−OT3)/$N_{x2}$/Tdco).

Figure 5:
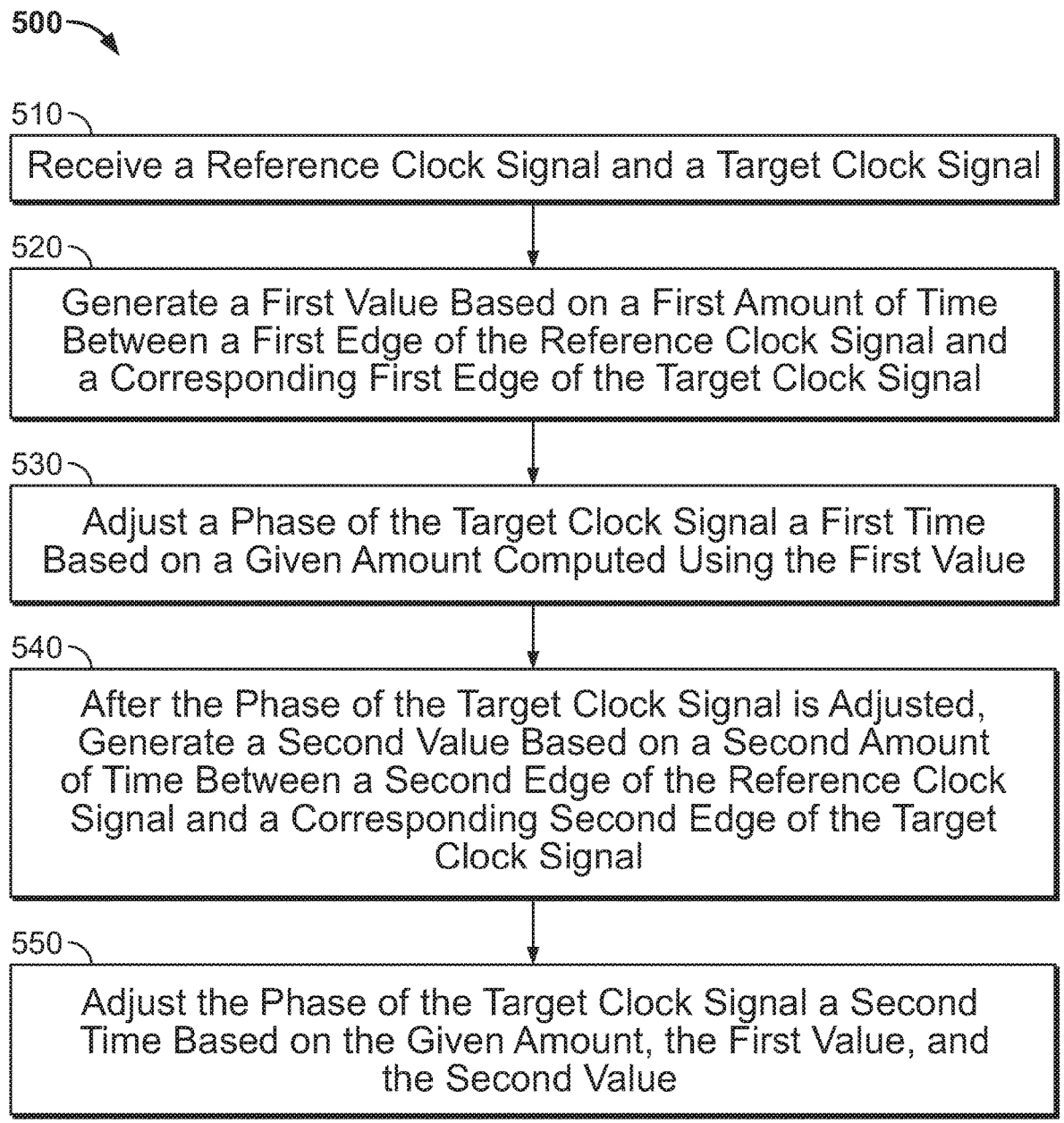
FIG. 5 is an illustrative process for performing phase error correction in accordance with various embodiments.

Control circuitry 150 may be based on any suitable processor or processing circuitry. Control circuitry 150 may control some or all components of the systems described herein (e.g., system 100 and/or system 300). Control circuitry 150 may receive and run instructions for implementing a process for performing phase error correction. Such instructions may be transitory or non-transitory and may be stored in a transitory or non-transitory medium such as a storage device (not shown) in system 100 or 300. For example, control circuitry 150 may receive instructions for implementing process 500 (FIG. 5).

Figure 3:
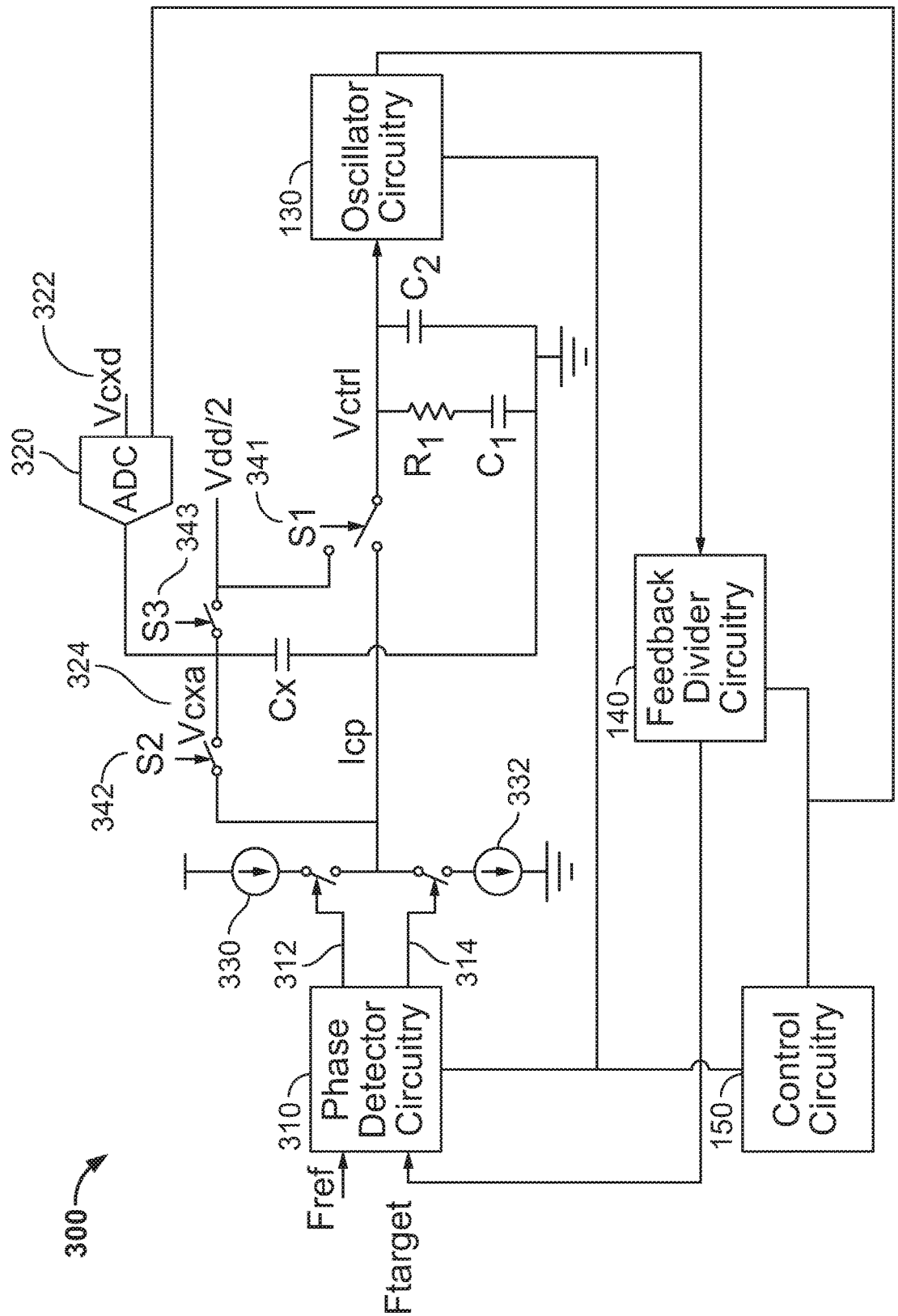
FIG. 3 shows an exemplary analog phase error correction system in accordance with various embodiments.

FIG. 3 shows an exemplary analog phase error correction system 300 in accordance with various embodiments. System 300 includes phase detector circuitry 310, current amplifiers 330 and 332, a first switch 341, a second switch 342 and a third switch 343, an analog to digital converter (ADC) 320, oscillator circuitry 130, control circuitry 150 and feedback divider circuitry 140. The operation of system 300 is described using the timing diagram 400 shown in FIG. 4.

Analog phase error correction system 300 operates to correct a phase of target frequency clock signal (Ftarget) based on a reference frequency clock signal (Fref) in a similar manner as system 100 in four clock cycles of Fref. Phase detector circuitry 310 may assert signal 312 when the Fref signal leads Ftarget signal. Phase detector circuitry 310 may assert signal 314 when the Fref signal lags Ftarget signal. Phase detector circuitry 310 may assert both signals 312 and 314 when the Fref signal is synchronized with Ftarget signal. By modifying which signal 312 or 314 is asserted based on the lead or lag of the Fref signal, different voltages are applied to Vcxa 324. As such, while Fref is asserted and Ftarget is not asserted, Vcxa starts to rise and stops rising when Ftarget is asserted. This creates a particular voltage representation by ADC 320 of how long Fref was asserted before Ftarget was asserted which represents a time difference between the rising edge of the Fref clock and the rising edge of the Ftarget clock.

In some embodiments, first switch 341, second switch 342 and third switch 343 may be toggled in accordance with timing diagram 400 on the rising edge of the Fref signal. Also, the phase adjustment variable ($N_x$) may be set in feedback divider circuitry 140 on the rising edge of the Ftarget signal. As discussed above, control circuitry 150 may control the components of system 300 to toggle the switches and set various values (e.g., $N_x$).

As discussed above, phase error correction may be performed in four clock cycles of the Fref signal. Initially, when phase error correction is started, first switch 341 may be set to open which couples the input to oscillator 130 to the output of third switch 343. Also, initially, second switch 342 and third switch 343 may be closed to connect the output of phase detector circuitry 310 to Vdd/2. At this point, Vctrl and Vcxa are initialized.

After Vctrl and Vcxa are initialized, during a first clock cycle, first switch 324 remains in the open position, second switch 342 remains closed, and third switch 343 is set to open. During a first clock cycle, the dividing ratio of feedback divider circuitry 140 is set to a constant and the first time value 410 at the output Vcxd 322 of ADC 320 is measured. First time value 410 (Vcx1) at the output Vcxd 322 represents a first time difference between the rising edge of the Fref signal and the rising edge of the Ftarget signal. This first time value 410 (Vcx1) is used for adjusting the dividing ratio of feedback divider circuitry 140 in a second clock cycle.

During the second clock cycle, first switch 324 remains in the open position, second switch 342 is opened, and third switch 343 is closed. During this second clock cycle of the Fref signal, the phase adjustment variable ($N_x$) of feedback divider circuitry 140 may be set to a second division value 432 ($N_{x2}$) based on first time value 410 (Vcx1). The setting of the phase adjustment variable ($N_x$) to second division value 432 may be performed upon detecting the rising edge of the Ftarget signal. This results in feedback divider circuitry 140 outputting Ftarget signal that corresponds to the oscillator circuitry 130 signal output being frequency divided based on the constant $N_{div}$ and second division value 432 ($N_{x2}$) (e.g., $1/(N_{div}+N_{x2})$).

During a third clock cycle of the Fref signal, first switch 324 remains in the open position, second switch 342 is closed, and third switch 343 is opened. During the third clock cycle of the Fref signal, the dividing ratio of feedback divider circuitry 140 is set to a constant and the second time value 420 at the output Vcxd 322 of ADC 320 is measured. Second time value 420 (Vcx3) at the output Vcxd 322 represents a second time difference between the rising edge of the Fref signal and the rising edge of the Ftarget signal. This second time value 420 (Vcx3) is used for adjusting the dividing ratio of feedback divider circuitry 140 in a fourth clock cycle.

During a fourth clock cycle of the Fref signal, first switch 324 remains in the open position, second switch 342 is open, and third switch 343 is closed. During the fourth clock cycle of the Fref signal, phase adjustment variable ($N_x$) of feedback divider circuitry 140 may be set to a third division value 434 ($N_{x4}$) based on first time value Vcx1 410, second time value Vcx3 420, and second division value 432. For example, third division value 434 ($N_{x4}$) may be set to an integer number computed in accordance with round ($N_{x2}$*Vcx3/(Vcx1−Vcx3)), wherein Vcx1 corresponds to first time value 410, Vcx3 corresponds to second time value 420, and $N_{x2}$ corresponds to second division value 432. The setting of the phase adjustment variable ($N_x$) to third value 434 may be performed upon detecting the rising edge of the Ftarget signal. This results in feedback divider circuitry 140 outputting Ftarget signal that corresponds to the oscillator circuitry 130 signal output being frequency divided based on the constant $N_{div}$ and third division value 434 ($N_{x4}$) (e.g., $1/(N_{div}+N_{x4})$).

After the fourth clock cycle, the Ftarget signal is synchronized with the Fref signal. At this time, first switch 324 is closed, second switch 342 is open, and third switch 343 is opened. Also, the division factor of feedback divider circuitry 140 is set to a constant (e.g., Nx=0).

FIG. 5 is an illustrative process 500 for performing phase error correction in accordance with various embodiments. At 510, a reference clock signal and a target clock signal are received. For example, Fref and Ftarget are received by time measurement circuitry 110 (FIG. 1). Similarly, Fref and Ftarget are received by phase detector circuitry 310 (FIG. 3).

Figure 4:
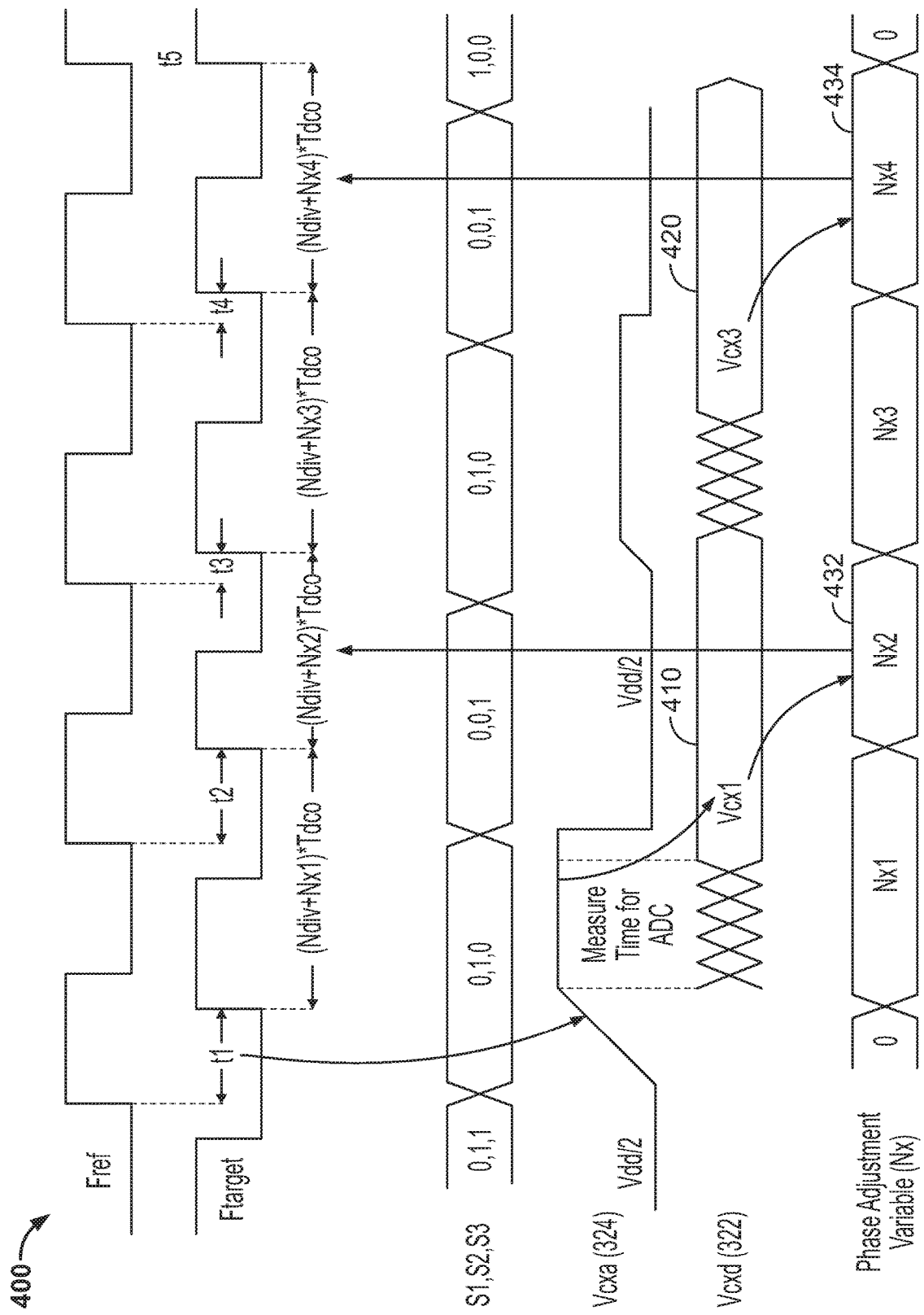
FIG. 4 shows an exemplary timing diagram for performing analog phase error correction in accordance with various embodiments.

At 520, a first value is generated based on a first amount of time between a first edge of the reference clock signal and a corresponding first edge of the target clock signal. For example, first time value 220 output by time measurement circuitry 110 represents an amount of time between a rising edge of Fref and a rising edge of Ftarget (FIGS. 1 and 2). Similarly, first time value 410 output by ADC 320 represents an amount of time between a rising edge of Fref and a rising edge of Ftarget (FIGS. 3 and 4).

At 530, a phase of the target clock signal is adjusted a first time based on a given amount computed using the first value. For example, a division value of feedback divider circuitry 140 ($N_{x2}$) is set based on first time value 220 or 410.

At 540, after the phase of the target clock signal is adjusted, a second value is generated based on a second amount of time between a second edge of the reference clock signal and a corresponding second edge of the target clock signal. For example, second time value 222 output by time measurement circuitry 110 represents an amount of time between a rising edge of Fref and a rising edge of Ftarget (FIGS. 1 and 2). Similarly, second time value 420 output by ADC 320 represents an amount of time between a rising edge of Fref and a rising edge of Ftarget (FIGS. 3 and 4).

At 550, the phase of the target clock signal is adjusted a second time based on the given amount, the first value, and the second value. For example, a division value of feedback divider circuitry 140 is adjusted or set based on (1) first time value 220 or 410, (2) second time value 222 or 420 and (3) the division value 232 or 432 ($N_{x2}$) of feedback divider circuitry 140 at the second clock cycle.

The foregoing describes methods and an apparatus for performing phase error correction. The above-described embodiments of the present disclosure are presented for the purposes of illustration and not of limitation. Furthermore, the present disclosure is not limited to a particular implementation. For example, one or more steps of the methods described above may be performed in a different order (or concurrently) and still achieve desirable results. In addition, the disclosure may be implemented in hardware, such as on an application-specific integrated circuit (ASIC) or on a field-programmable gate array (FPGA). The disclosure may also be implemented in software by, for example, encoding transitory or non-transitory instructions for performing the process discussed above in one or more transitory or non-transitory computer-readable media.

What is claimed is:

1. A method for performing phase error correction, the method comprising:

receiving, at a phase detector circuitry, a reference clock signal and a target clock signal;

at a first clock cycle of the reference clock signal subsequent to the receiving:

setting a phase adjustment variable of a feedback divider circuitry to be a first division value equal to zero; and generating, at the phase detector circuitry, a first value indicative of a first amount of time between a first edge of the reference clock signal and a corresponding first edge of the target clock signal;

at a second clock cycle of the reference clock signal immediately next to the first clock cycle:

setting the phase adjustment variable of the feedback divider circuitry to be a second division value based on the first value; and adjusting, at the feedback divider circuitry communicatively coupled to the phase detector circuitry, a phase of the target clock signal a first time based on the phase adjustment variable;

at a third clock cycle of the reference clock signal immediately next to the second clock cycle after the phase of the target clock signal is adjusted:

setting the phase adjustment variable of the feedback divider circuitry to be the first division value equal to zero; and generating, at the phase detector circuitry, a second value indicative of a second amount of time between a second edge of the reference clock signal and a corresponding second edge of the target clock signal;

at a fourth clock cycle of the reference clock signal immediately next to the third clock cycle:

setting the phase adjustment variable of the feedback divider circuitry to be a third division value based on the first value, the second value, and the second division value; and completing phase adjustment by adjusting, at the feedback divider circuitry, the phase of the target clock signal a second time based on the value phase adjustment variable.

2. The method of claim 1, wherein the phase is adjusted the first time during the second clock cycle of the reference clock signal and the phase is adjusted the second time during the fourth clock cycle of the reference clock signal.

3. The method of claim 2, wherein the first amount of time is measured during the first clock cycle of the reference clock signal and the second amount of time is measured during a third clock cycle of the reference clock signal.

4. The method of claim 1, wherein adjusting the phase comprises modifying a feedback divider ratio based on the phase adjustment variable.

5. The method of claim 4, wherein the feedback divider ratio corresponds to an inverse of a sum of a constant and the phase adjustment variable.

6. The method of claim 1, wherein the second division value is computed in accordance with:

$$Nx_2 = \text{round}(OT1/g\_tdc\_est/Tdco/2)$$

where $Nx_2$ is the second division value, OT1 is the first value, g_tdc_est is a first constant, and Tdco is a second constant.

7. The method of claim 1, wherein the third division value is computed in accordance with:

$$Nx_4 = \text{round}(Nx_2 * OT3/(OT1-OT3))$$

where $Nx_4$ is the third division value, $Nx_2$ is the second division value, OT1 is the first value, and OT3 is the second value.

8. The method of claim 1, wherein the target clock signal corresponds to an output of a digitally controlled oscillator.

9. The method of claim 1, wherein the target clock signal corresponds to an output of a voltage controlled oscillator.

10. A system for performing phase error correction, the system comprising:
a phase detector circuitry configured to:
receive a reference clock signal;
receive a target clock signal output from feedback divider circuitry;
generate, at a first clock cycle of the reference clock signal subsequent to the receiving, a first value based on a first amount of time between a first edge of the reference clock signal and a corresponding first edge of the target clock signal;
output the generated first value to the feedback divider circuitry;
the feedback divider circuitry configured to:
set a phase adjustment variable to be a first division value equal to zero during the first clock cycle;
receive the generated first value from the phase detector circuitry;
set the phase adjustment variable to be a second division value based on the first value during a second clock cycle;
adjust, at the second clock cycle of the reference clock signal immediately next to the first clock cycle, a phase of the target clock signal a first time based on the phase adjustment variable;
output the target clock signal with the adjusted phase to an input of the phase detector circuitry; and
set the phase adjustment variable to be the first division value equal to zero during a third clock cycle;
the phase detector circuitry further configured to:
receive, from the feedback divider circuitry, the target clock signal with the phase adjusted based on the given amount computed using the first value;
at the third clock cycle of the reference clock signal immediately next to the second clock cycle, generate a second value based on a second amount of time between a second edge of the reference clock signal and a corresponding second edge of the target clock signal; and the feedback divider circuitry, further configured to:
set the phase adjustment variable to be a third division value based on the first value, the second value, and the second division value during a fourth clock cycle; and
adjust, at the fourth clock cycle of the reference clock signal immediately next to the third clock cycle, the phase of the target clock signal a second time based on the phase adjustment variable.

11. The system of claim 10, wherein the phase is adjusted the first time during the second clock cycle of the reference clock signal and the phase is adjusted the second time during the fourth clock cycle of the reference clock signal.

12. The system of claim 11, wherein the first amount of time is measured during the first clock cycle of the reference clock signal and the second amount of time is measured during the third clock cycle of the reference clock signal.

13. The system of claim 10, wherein the feedback divider circuitry configured to adjust the phase is further configured to modify a feedback divider ratio based on the phase adjustment variable.

14. The system of claim 13, wherein the feedback divider ratio corresponds to an inverse of a sum of a constant and the phase adjustment variable.

15. The system of claim 10, wherein the second division value is computed in accordance with:

$$Nx_2 = \text{round}(OT1/g\_tdc\_est/Tdco/2)$$

where $Nx_2$ is the second division value, OT1 is the first value, g_tdc_est is a first constant, and Tdco is a second constant.

16. The system of claim 10, wherein the third division value is computed in accordance with:

$$Nx_4 = \text{round}(Nx_2 * OT3/(OT1-OT3))$$

where Nx4 is the third division value, $Nx_2$ is the second division value, OT1 is the first value, and OT3 is the second value.

17. The system of claim 10, wherein the target clock signal corresponds to an output of a digitally controlled oscillator.

18. The system of claim 10, wherein the target clock signal corresponds to an output of a voltage controlled oscillator.

* * * * *